(12) United States Patent
Spencer et al.

(10) Patent No.: US 10,534,411 B2
(45) Date of Patent: Jan. 14, 2020

(54) HARD DRIVE CARRIER

(71) Applicant: HEWLETT PACKARD ENTERPRISE DEVELOPMENT LP, Houston, TX (US)

(72) Inventors: Stephen Spencer, Houston, TX (US); Belgie B McClelland, Tomball, TX (US); Earl W Moore, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/515,954

(22) PCT Filed: Oct. 2, 2014

(86) PCT No.: PCT/US2014/058767
§ 371 (c)(1),
(2) Date: Mar. 30, 2017

(87) PCT Pub. No.: WO2016/053336
PCT Pub. Date: Apr. 7, 2016

(65) Prior Publication Data
US 2017/0300092 A1    Oct. 19, 2017

(51) Int. Cl.
*G06F 1/18*    (2006.01)
*H05K 7/14*    (2006.01)

(52) U.S. Cl.
CPC .............. *G06F 1/187* (2013.01); *G06F 1/181* (2013.01); *H05K 7/14* (2013.01)

(58) Field of Classification Search
CPC ............ G06F 1/187; G06F 1/181–188; G11B 33/121–128; H05K 7/14; H05K 7/1401;
(Continued)

(56) References Cited

U.S. PATENT DOCUMENTS 5,673,172 A     9/1997  Hastings
5,717,570 A *   2/1998  Kikinis .................. G06F 1/181
                                                    312/223.2
(Continued)

FOREIGN PATENT DOCUMENTS

TW    M258057 U    3/2005
TW    M289897 U    4/2006

OTHER PUBLICATIONS

STIC search, May 7, 2019 (Year: 2019).*
(Continued)

*Primary Examiner* — Steven T Sawyer
*Assistant Examiner* — Sagar Shrestha
(74) *Attorney, Agent, or Firm* — International IP Law Group PLLC

(57) ABSTRACT

A hard drive carrier and a method for removing a hard drive carrier from an enclosure are provided herein. In one example, the hard drive carrier includes a platform located in a center position on a front face of the hard drive carrier. The hard drive carrier includes a first pinch point and a second pinch point, where the second pinch point is located opposite of the first pinch point. The hard drive carrier also includes a first tab disposed adjacent to the first pinch point and a second tab, where the second tab is located opposite of the first tab.

15 Claims, 5 Drawing Sheets

(58) Field of Classification Search
CPC .. H05K 7/1411; H05K 7/1415; H05K 7/1474; H05K 5/0004; H05K 5/0013; H05K 5/02; H05K 5/0204; H05K 5/0217; H05K 5/0221; H05K 5/023
USPC ........................................................ 439/928.1
See application file for complete search history.

(56) References Cited

U.S. PATENT DOCUMENTS

| | | | | |
|---|---|---|---|---|
| 6,067,225 | A * | 5/2000 | Reznikov | G11B 33/122 |
| | | | | 312/223.2 |
| D444,474 | S | 7/2001 | Koken et al. | |
| 7,116,241 | B2 | 10/2006 | Post | |
| 7,443,668 | B2 * | 10/2008 | Hsu | G11B 33/12 |
| | | | | 312/223.1 |
| D593,101 | S | 5/2009 | Alfonso et al. | |
| 7,948,748 | B1 * | 5/2011 | Sivertsen | G11B 33/125 |
| | | | | 361/679.33 |
| 8,416,563 | B2 * | 4/2013 | Hou | H05K 7/1489 |
| | | | | 211/26 |
| 8,644,034 | B2 * | 2/2014 | Zheng | G06F 1/183 |
| | | | | 312/223.1 |
| 9,468,129 | B1 * | 10/2016 | Wang | G06F 1/187 |
| 9,558,789 | B1 * | 1/2017 | Van Pelt | G11B 33/127 |
| 2003/0099094 | A1 * | 5/2003 | Coles | H05K 7/1409 |
| | | | | 361/726 |
| 2004/0047128 | A1 | 3/2004 | McClelland | |
| 2006/0161936 | A1 * | 7/2006 | Permut | G11B 33/022 |
| | | | | 720/657 |
| 2008/0094794 | A1 | 4/2008 | Hass | |
| 2008/0157638 | A1 | 7/2008 | Liu | |
| 2008/0158810 | A1 | 7/2008 | Liu | |
| 2009/0097196 | A1 * | 4/2009 | Peng | G06F 1/187 |
| | | | | 361/679.34 |
| 2009/0279246 | A1 | 11/2009 | Nguyen | |
| 2009/0279248 | A1 | 11/2009 | Baker | |
| 2011/0182026 | A1 * | 7/2011 | Kang | G11B 33/124 |
| | | | | 361/679.37 |
| 2011/0188196 | A1 | 8/2011 | Sivertsen | |
| 2013/0264444 | A1 * | 10/2013 | Su | G11B 33/128 |
| | | | | 248/221.11 |

OTHER PUBLICATIONS

"Tagan A+ Seenium Case," Oct. 10, 2008, http://www.bjorn3d.com/2008/10/tagan-a-seenium-case.
Gilgamesh, "In Win BUC 101 Mid Tower Case Review," Feb. 2, 2012, http://www.overclockerstech.com/win-buc-101-mid-tower-case-review/all/1/.
Mark, "Corsair Carbide 400R Review," Apr. 25, 2012, http://www.pcgameware.co.uk/reviews/cases/corsair-carbide-r400/.
PCT/ISA/KR, International Search Report, dated May 29, 2015, 12 pps., PCT/US2014/058767.
Ryan Wisley, "NZXT H2 Classic Silent Midtower PC Case Review." Jun. 1, 2011, http://icrontic.com/article/nzxt-h2-classic-silent-midtower-pc-case-review.
Silicon Graphics Prism Visualization System User's Guide for Extreme Scalable Configurations. [online]. Silicon Graphics, Inc., Oct. 2005 [ retrieved on May 20, 2015] http://techpubs.sql.com/library/manuals/4000/007-4 77 4-002/pdf/007-4 77 4- 002.pdf.

* cited by examiner

100

200

300

300

400

HARD DRIVE CARRIER

BACKGROUND

A hard disk drive may be inserted into a hard drive carrier, where the carrier is installed in a computing device. In some cases, it may be necessary for a user to access the hard disk drive for repair or replacement, among other issues. However, the hard drive may be buried under the keyboard, the motherboard, or other components of the computing device, without the use of an access panel. As a result, a number of fasteners, such as screws and bolts, other computing components, and other parts and connectors, may need to be removed before a user can access the hard disk drive located within the hard drive carrier. In other aspects, the hard drive carrier may be accessible but due to its design, a user may encounter difficulties during its removal.

DESCRIPTION OF THE DRAWINGS

The advantages of the present techniques are better understood by referring to the following detailed description and the attached drawings, in which.

DETAILED DESCRIPTION OF SPECIFIC EXAMPLES

A hard drive carrier that stores a hard disk drive may be directly inserted into a drive bay of a computing device. If the hard drive carrier is located within a receiving frame for additional support, the receiving frame may then be directly inserted into the drive bay of the computing device. To promote electrical connectivity between the hard disk drive and the computing device, the electrical connections of the hard drive carrier may be utilized to receive or transmit electrical signals between other components within the computing device and the hard disk drive. As a result, the removable hard disk drive may improve storage capacity, data backup and recovery times, and portability, among others.

In some cases, a user may desire to remove the hard drive carrier from within the computing device to access the hard disk drive. For example, to increase the storage capacity of a computing device, a user may remove an existing hard disk drive within a hard drive carrier in order to replace it with a hard disk drive of a higher data storage capacity. In order to remove the hard drive carrier, the user may initially grab a designated area of the hard drive carrier utilized to remove the carrier. However, in some cases, the design of the hard drive carrier may hinder the user's ability to comfortably grab the carrier. For example, the size of the designated area may be limited so that the user may be hindered in adequately grasping the hard drive carrier and thus, the user may experience difficulties during removal.

Examples described herein describe a hard drive carrier designed to provide increased functionality and comfort to a user when removing the hard drive carrier from an enclosure. The design may include a platform area on an external front face of the hard drive carrier that includes pinch points. Each pinch point may provide an adequate gripping surface area for a user to remove the hard drive carrier with limited difficulties and discomfort.

Figure 1:
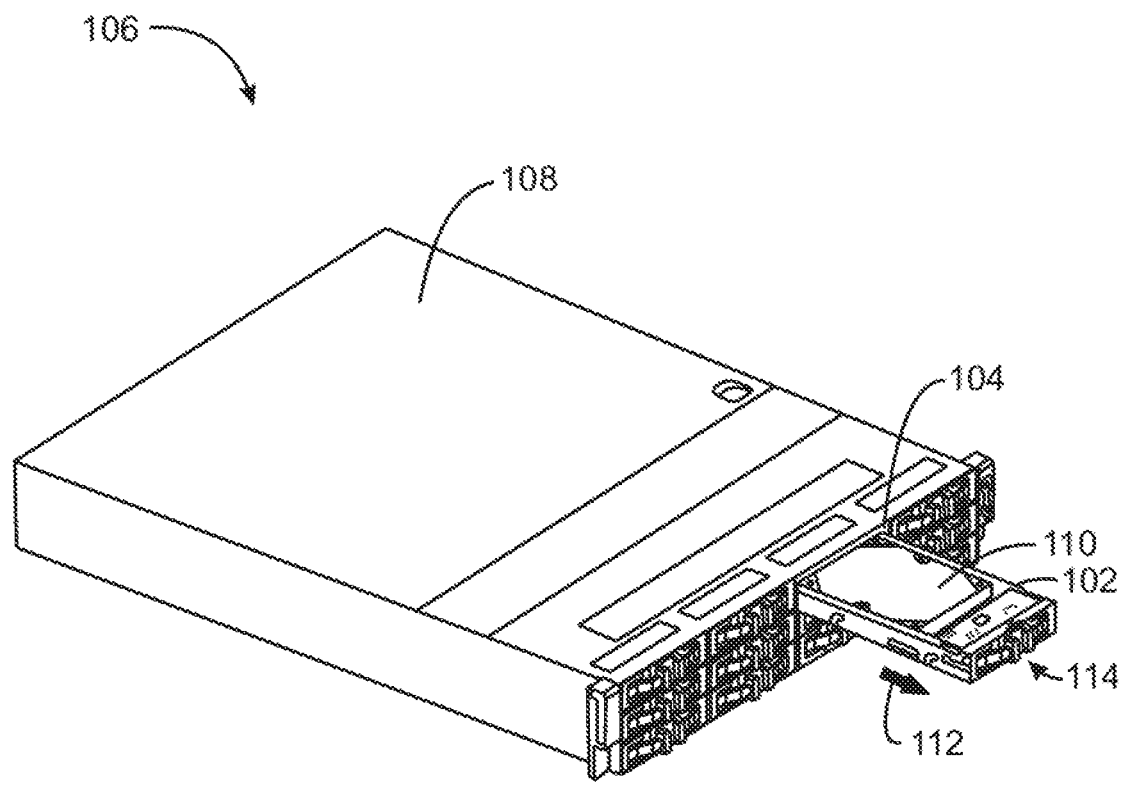
FIG. 1 is a perspective view of a hard drive carrier extending out of a drive bay of a computing device, according to an example.

FIG. 1 is a perspective view 100 of a hard drive carrier 102 extending out of a drive bay 104 of a computing device 106. A computer enclosure, for example, a computer case 108, may be utilized to house most of the internal components of the computing device 106. The computing case 108 may include the drive bay 104, which as used herein is an empty area within the computing case 108 reserved for the insertion of computer hardware. For example, the drive bay 104 may be used to interface various types of computer hardware including a hard disk drive, universal serial bus (USB), an input/out (I/O) bay, and a card reader, among other computer components.

The computer case 108 may include a number of drive bays 104, where each drive bay 104 is designed to house an individual hard drive carrier 102. In the illustrated example, each hard drive carrier 102 may be removed from its respective drive bay 104. As shown in FIG. 1, an arrow 112 indicates the removal of the hard drive carrier 102 from within its associated drive bay 104. As a result, a user may access a hard disk drive 110 stored within the carrier 102. In some examples, each hard drive carrier 102 may be disposed in a receiving frame, where the receiving frame can be inserted into each of the drive bays 104. The use of the receiving frame as additional support for the hard drive carrier 102 will be discussed with respect to FIGS. 3A, 3B.

In some cases, the user may desire to remove several of the hard drive carriers 102 from within their respective drive bays 104. Such repetitive motions may be difficult for the user. As such, each hard drive carrier 102 may be designed with a platform area 114 to provide the user with an accessible grip area to promote a less-demanding user experience. The components of the hard drive carrier 102, including the platform area 114, will be described in greater detail with respect to FIG. 2.

Figure 2:
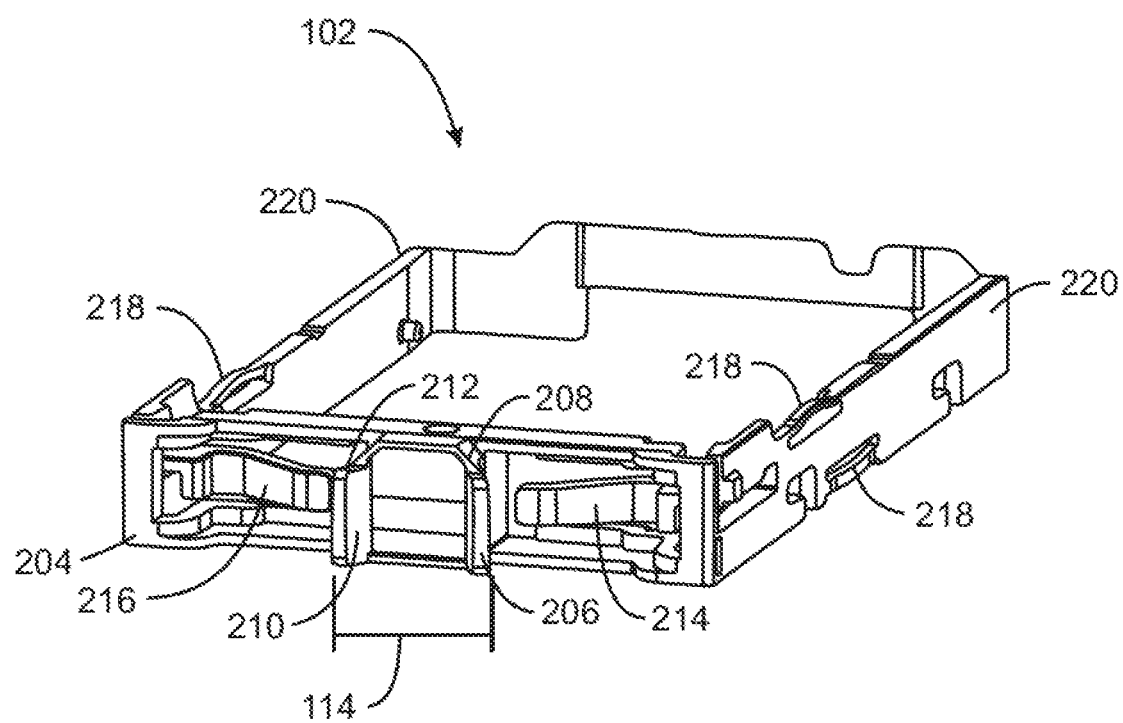
FIG. 2 is a perspective view of the hard drive carrier, according to an example.

FIG. 2 is a perspective view 200 of the hard drive carrier 102. Like numbered items are as described with respect to FIG. 1. To provide a grip area for a user, the hard drive carrier 102 may be designed to include a platform area 114. The platform area 114 may be located in a center position on a front face 204 of the hard drive carrier 102. A first pinch point 206 may be located on a first side 208 of the platform area 202. A second pinch point 210 may be located on a second side 212 of the platform area 202, wherein the second pinch point 210 is located opposite to the first pinch point 206. As shown in FIG. 2, the first pinch point 206 and the second pinch point 210 extend outward, away from the front face 204 of the platform area 114. As a result, the first and second pinch points 206, 210 may provide a user with a surface area to grasp in order to maintain control of the hard drive carrier 102 during its removal from a drive bay 104, as illustrated in FIG. 1.

The hard drive carrier 102 may include several tabs on its front face 204. In particular, a first tab 214 may be disposed adjacent to the first pinch point 206. A second tab 216 may be located opposite of the first tab 214 so as to be disposed adjacent to the second pinch point 210. Each tab 214, 216 may be utilized in conjunction with the first and second pinch points 206, 210 to release the hard drive carrier 102 from within the drive bay 104 of FIG. 1. To remove the hard drive carrier 102, the user may utilize both the first and second pinch points 206, 210 and the first and second tabs 214, 216 using a pinch motion and a push motion, as will be described in further detail with respect to FIG. 3.

The hard drive carrier 102 may be formed from a single piece of material, for example, a single plastic part. In some aspects, the use of a single plastic part may reduce costs by lowering the number of moving or complex parts associated with the hard drive carrier 102. As illustrated in FIG. 2, the hard drive carrier 102 may include plastic springs 218 formed within the single plastic part and located on side surfaces 220 of the hard drive carrier 102. Due to the integration of the plastic springs 218 within the material of the hard drive carrier 102, the size of the plastic springs 218 may be reduced as compared to the size of conventional plastic springs, thus, possibly reducing the level of resistance against the walls of the drive bay 104 of FIG. 1. This may allow the hard drive carrier 102 to be removed or inserted with an uninterrupted sliding motion.

Figure 3A:
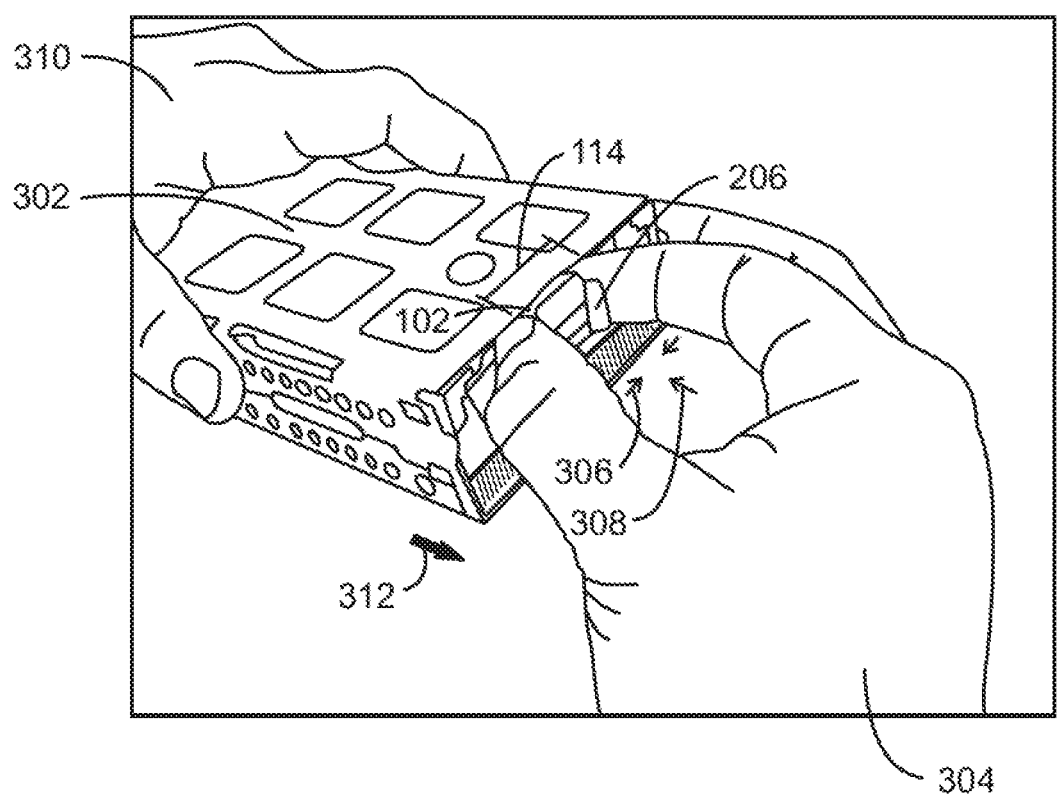
FIGS. 3A and 3B are illustrations of the hard drive carrier within an enclosure and the removal of the hard drive carrier from the enclosure.
Figure 3B:
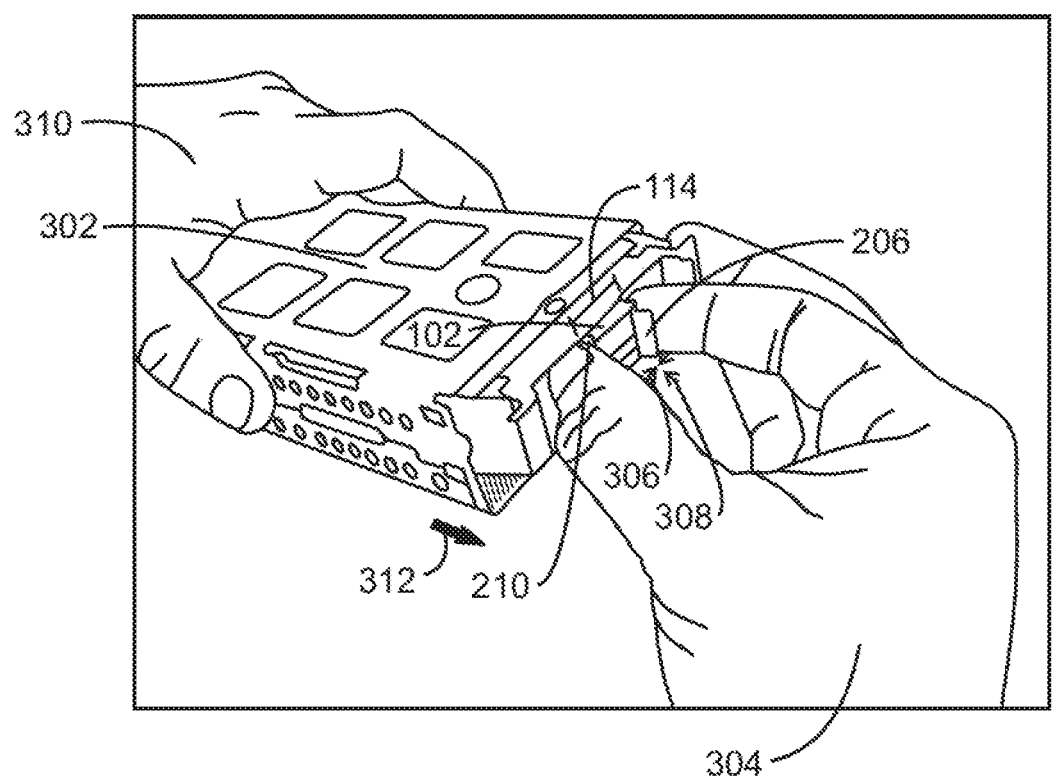

FIGS. 3A and 3B are illustrations 300 of the hard drive carrier 102 within an enclosure 302 and the removal of the hard drive carrier 102 from the enclosure. Like numbered items are as described with respect to FIGS. 1 and 2. As shown in FIGS. 3A and 3B, the enclosure 302 is designed to maintain and support the hard drive carrier 102 during its installation. In some embodiments, the enclosure 302 may include a drive bay, as describe with respect to FIG. 1, or a receiving frame. The receiving frame 302 may be considered as a staging area for the removal, insertion, or both, of the hard drive carrier 102 before it is inserted into the drive bay.

To remove the hard drive carrier 102 from the enclosure 302, the fingers of a user's hand 304 may be used to initiate a pinching action 306 upon a first pinch point 206 and a second pinch point 210, as shown in FIG. 2, located opposite to the first pinch point 206. The first pinch point 206 and the second pinch point 210 may be located within a platform area 114 of the hard drive carrier 102 to provide an increase in the surface area of the platform area 114. As a result, the user may be provided with a substantial area in which to grab and remove the hard drive carrier 102. Additionally, the fingers of the user's hand 304 may be used to initiate a pushing action 308 upon a first tab 214 and a second tab 216 located on a front face 204 of the hard drive carrier 102, as shown in FIG. 2.

The fingers of the user's hand 304 may simultaneously press the first pinch point 206 and the second pinch point 210 to produce the pinching action 306 by squeezing the pinch points 206, 210 in an inward direction. While maintaining the pinching action 306, the user may initiate the pushing action 308 to press the first and second tabs 214, 216, as shown with respect to FIG. 2, in a backward direction. Once the user has established a grip of the hard drive carrier 102 via the pinch points 206, 210, the user may initiate a forward pulling motion 312 upon the hard drive carrier 102 to release and remove the carrier 102.

In some cases, the pinching action 306 and pushing action 308 may be carried out simultaneously. The combination of the pinching action 306 and the pushing action 308 may provide a smooth release of the hard drive carrier 102 from within the enclosure. In some cases, as shown in FIGS. 3A and 3B, the user may use another hand 310 to hold the enclosure 302 during the removal of the hard drive carrier 102.

Figure 4:
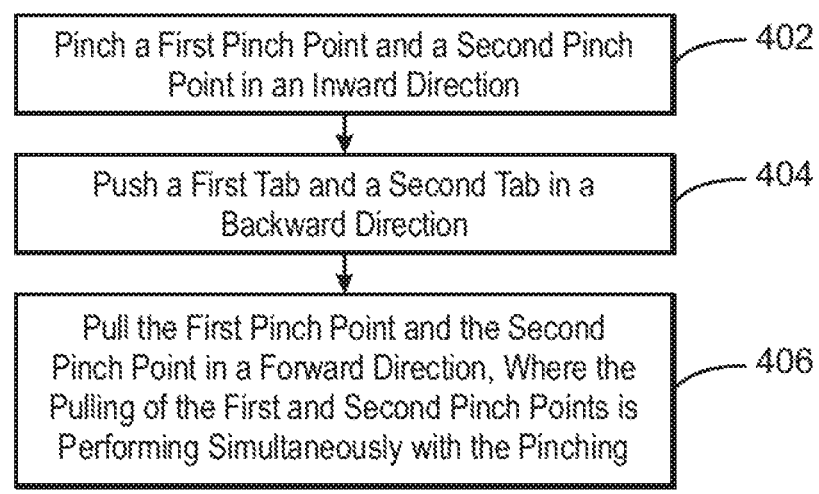
FIG. 4 is a method for removing a hard drive carrier from an enclosure.

FIG. 4 is a method 400 for removing a hard drive carrier from an enclosure. A hard drive carrier may be located within an enclosure of a computing device. For example, the enclosure may include a drive bay, a receiving frame, or any other type of suitable enclosure. Based on the discretion of a user, it may be necessary to remove the hard drive carrier.

Thus, a platform area of the hard drive carrier may provide a surface area in which the user may grasp to pull and release the hard drive carrier. In particular, the platform area may include a first pinch point and a second pinch point located opposite of the first pinch point. At block 402, the first pinch point and the second pinch point may be subjected to a pinching motion in an inward direction.

A first tab may be located adjacent to the first pinch point and a second tab may be located adjacent to the second pinch point on a front face of the hard drive carrier. At block 404, the first tab and the second tab may be subjected to a pushing motion in a backward direction. In some cases, the pinching motion and the pushing motion may be carried out simultaneously. At block 406, while maintaining the pinching motion and the pushing motion, the hard drive carrier may be pulled in a forward direction to release the hard drive carrier from within the computing device.

What is claimed is:

1. A hard drive carrier, comprising:
    a platform located in a center position on a front face of the hard drive carrier;
    a first pinch point connected to a first side of the platform, wherein the first pinch point extends outward from the first side of the platform;
    a second pinch point connected to a second side of the platform, wherein the second pinch point is located opposite to the first pinch point, wherein the second pinch point extends outward from the second side of the platform, and wherein the first and second pinch points are gripped by a pinch action;
    a first tab disposed adjacent to the first pinch point; and
    a second tab disposed adjacent to the second pinch point, wherein the second tab is located opposite the first tab and wherein the first and second tabs are bent when subjected to a push action in a same direction orthogonal to the pinch action.

2. The hard drive carrier of claim 1, wherein the first and second pinch points provide a surface area to promote the pinch action.

3. The hard drive carrier of claim 1, wherein the platform area provides a leverage point to promote the pinch action upon the first and second pinch points and the push action upon the first and second tabs.

4. A method of removing a hard drive carrier from an enclosure, comprising:
    pinching a first pinch point and a second pinch point in an inward direction, wherein the first pinch point is connected to a first side of a platform located on a front face of the hard drive carrier and extends outward from the first side of the platform, and the second pinch point is connected to a second side of the platform opposite to the first pinch point and extends outward from the second side of the platform;
    pushing a first tab and a second tab in a same backward direction orthogonal to the pinch action, wherein the second tab is located opposite the first tab; and
    pulling the first pinch point and the second pinch point in a forward direction, wherein the pulling of the first and second pinch points is performed simultaneously with the pinching.

5. The method of claim 4, wherein the pushing of the first tab and the second tab is performed simultaneously with the pinching of the first and second pinch points.

6. The method of claim 4, comprising sliding the hard drive carrier in a forward direction to release the hard drive carrier from the enclosure.

7. The method of claim 4, wherein the pinching, pulling, and pushing are maintained until the hard drive carrier is removed from the enclosure.

8. A computing device, comprising:
   an enclosure;
   a hard drive carrier located within the enclosure, the hard drive carrier comprising:
      a platform located in a center position on a front face of the hard drive carrier;
      a first pinch point connected to a first side of the platform, wherein the first pinch point extends outward from the first side of the platform;
      a second pinch point connected to a second side of the platform, wherein the second pinch point is located opposite to the first pinch point, wherein the second pinch point extends outward from the second side of the platform, and wherein the first and second pinch points comprise a substantial surface area to promote a simultaneous pinch action upon the first and second pinch points;
      a first tab disposed adjacent to the first pinch point; and
      a second tab disposed adjacent to the second pinch point, wherein the second tab is located opposite the first tab, wherein the first and second tabs are bent when subjected to a push action in a same direction orthogonal to the pinch action; and
   a hard disk drive located within the hard drive carrier.

9. The computing device of claim 8, wherein the platform area provides a leverage point to promote a pinch action upon the first and second pinch points and a push action upon the first and second tabs.

10. The computing device of claim 8, wherein a material of the hard drive carrier comprises a single piece of plastic material.

11. The computing device of claim 8, further comprising a plurality of plastic springs on a first side surface and on a second side surface of the hard drive carrier.

12. The hard drive carrier of claim 1, wherein a material of the hard drive carrier comprises a single piece of plastic material.

13. The hard drive carrier of claim 1, wherein a tab of the first and second tabs, where subjected to the push action, bends the hard drive carrier such that the hard drive carrier is removable from the enclosure by a pulling action.

14. The computing device of claim 8, wherein a tab of the first and second tabs, where subjected to the push action, bends the hard drive carrier such that the hard drive carrier is removable from the enclosure by a pulling action.

15. The hard drive carrier of claim 1, further comprising a plurality of plastic springs on a first side surface and on a second side surface of the hard drive carrier.

* * * * *